United States Patent
Keshavarzi et al.

(10) Patent No.: US 6,828,638 B2
(45) Date of Patent: Dec. 7, 2004

(54) DECOUPLING CAPACITORS FOR THIN GATE OXIDES

(75) Inventors: Ali Keshavarzi, Portland, OR (US); Vivek K. De, Beaverton, OR (US); Tanay Karnik, Portland, OR (US); Rajendran Nair, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/469,406

(22) Filed: Dec. 22, 1999

(65) Prior Publication Data

US 2002/0140109 A1 Oct. 3, 2002

(51) Int. Cl.[7] .................. H01L 29/76; H01L 27/108
(52) U.S. Cl. .................. 257/392; 257/391; 257/402; 257/313; 438/217; 438/288; 438/299
(58) Field of Search .................. 257/300, 782, 257/532, 402–407, 348, 391–392, 313; 438/217, 288, 299

(56) References Cited

U.S. PATENT DOCUMENTS

| | | | |
|---|---|---|---|
| 5,032,892 A | * | 7/1991 | Chern et al. .................. 357/51 |
| 5,173,835 A | | 12/1992 | Cornett et al. |
| 5,405,790 A | | 4/1995 | Rahim et al. |
| 5,563,779 A | | 10/1996 | Cave et al. |
| 5,615,096 A | | 3/1997 | Stengel et al. |
| 5,883,423 A | * | 3/1999 | Patwa et al. .................. 257/532 |
| 5,962,887 A | | 10/1999 | Manning et al. |
| 5,965,912 A | | 10/1999 | Stolfa et al. |

OTHER PUBLICATIONS

G. Rizzoni, Principles and Applications of Electrical Engineering (2nd Ed. 1996), pp. 428–439.
N. Weste et al., "Principles of CMOS VLSI Design" (Addison–Wesley, 2nd Ed. 1993), pp. 41–51 and 180–187.
R. Pierret, "Field Effect Devices, vol. IV of Modular Series on Sold State Devices" (Addison–Wesley, 2nd Ed. 1990), pp. 47–59.

* cited by examiner

Primary Examiner—Donghee Kang
(74) Attorney, Agent, or Firm—Alan K. Aldous

(57) ABSTRACT

In some embodiments, the invention involves a die having a first conductor carrying a power supply voltage and a second conductor carrying a ground voltage. A semiconductor capacitor operating in depletion mode is coupled between the first and second conductors to provide decoupling capacitance between the first and second conductors, the semiconductor capacitor having a gate voltage. Various configurations may be used including: n+ gate poly and n+ source/drain regions in an n-body; p+ gate poly and n+ source/drain regions in an n-body; p+ gate poly and p+ source/drain regions in an n-body; p+ gate poly and p+ source/drain regions in a p-body; n+ gate poly and p+ source/drain regions in a p-body; n+ gate poly and n+ source/drain regions in a p-body. The power supply voltage may have a larger absolute value than does a flatband voltage.

20 Claims, 5 Drawing Sheets

DECOUPLING CAPACITORS FOR THIN GATE OXIDES

BACKGROUND OF THE INVENTION

1. Technical Field of the Invention

The present invention relates to integrated circuits and, more particularly, to decoupling capacitors in integrated circuits.

2. Background Art

Decoupling capacitors ("decaps") are used in integrated circuit (IC) design for noise decoupling. Indeed, they are heavily used in virtually all IC's. One type of semiconductor capacitor is called a MOS-C or metal oxide semiconductor capacitor. The MOS-C has two terminals separated by a dielectric region (which includes at least an insulator, such as gate oxide). One of the terminals is the gate and the other is the body (and perhaps source and drain diffusions). Another type of semiconductor capacitor is using a field effect transistor (FET) such as an n-channel metal oxide semiconductor FET (NMOSFET) or a p-channel metal oxide semiconductor FET (NMOSFET). One of the terminals is the gate and the other terminal is the source, drain, and body. The terminals are separated by a dielectric (which includes at least an insulator, such as gate oxide). A difference between a MOS-C and a FET capacitor are that with a FET, the source and drains have a different polarity type than does the body. With a MOS-C, the source/drain diffusions (if present) have the same polarity as the body. The behavior of capacitors in integrated circuits is described in R. Pierret et al., "Field Effect Devices," (Addison-Wesley, 2nd Ed. 1990), pp. 47–59; and in N. Weste et al., "Principles of CMOS VLSI Design," (Addison-Wesley, 2nd Ed. 1993), pp. 180–82.

Other decoupling capacitors such as a capacitor sandwiched in between two metal lines with a high dielectric constant insulator are also possible. However, the material challenge and integration in today's MOS technology will be very difficult.

The capacitance C of a capacitor is given by the equation $C = \epsilon A/d$, were $\epsilon$ is the dielectric constant, A is the area, and d is the distance. In the design IC's, it is desirable to make the dimensions of the components small. Accordingly, over the years, the area A of the capacitors has become smaller, while the distance d between electrodes has also become smaller. Currently used capacitor structures generally work fairly well with oxides that do not leak. The current decoupling capacitors structures have voltages applied to keep the MOS-C in inversion resulting in maximum per unit area capacitance value, with good high frequency response time, and low series resistance. As process technology scales, gate oxide thickness also scales in order to maintain transistors with good drive current capabilities and a good short channel behavior. As gate oxides continue to scale (e.g., below 30A), this capacitive configuration results in high leakage conduction through oxide (e.g., elevated tunneling leakage).

SUMMARY

In some embodiments, the invention includes a die having a first conductor carrying a power supply voltage and a second conductor carrying a ground voltage. A semiconductor capacitor operating in depletion mode is coupled between the first and second conductors to provide decoupling capacitance between the first and second conductors, the semiconductor capacitor having a gate voltage.

Various configurations may be used including: n+ gate poly and n+ source/drain regions in an n-body; p+ gate poly and n+ source/drain regions in an n-body; p+ gate poly and p+ source/drain regions in an n-body; p+ gate poly and p+ source/drain regions in a p-body; n+ gate poly and p+ source/drain regions in a p-body ; n+ gate poly and n+ source/drain regions in a p-body. The power supply voltage may have a larger absolute value than does a flatband voltage.

Additional embodiments are described and claimed.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

The invention involves operating semiconductor capacitors (transistor or MOS-C) in a depletion mode to reduce leakage through the insulator (e.g., gate oxide). This is counter-intuitive because operating in the depletion mode reduces the capacitance per area. To make up for this reduction in capacitance, the area may be made bigger, which is undesirable. In the creation of the invention, the inventors noticed that by operating in the depletion mode, the number of carriers is smaller, so there will be a smaller amount of tunneling in the gate oxide and hence less leakage.

In general, the idea is to move away from using a MOS-C capacitor derived from a MOS transistor structure operating in inversion mode. The alternative suggestion is to use a capacitor structure using the gate oxide as an insulator operating in depletion mode. Effective capacitance reduces by about 25% (approximated) while leakage reduces by approximately a factor of 100 for approximately a 1V power supply technology. Capacitance reduction is observable in the C-V curve as the capacitor is biased in a depletion mode (close to accumulation region). The leakage reduction is due to the fact that we have less carriers in depleted channel under the gate oxide to tunnel through the thin gate oxide. The Q-factor of such capacitor will be similar to a MOS transistor cap in inversion specially if we do not rely on minority carrier generation and recombination to provide the carriers need to respond to the AC signal superimposed on the decap. We can always compensate for the reduced capacitance by using slightly larger area capacitor if we have to lower the leakage through the decap by more than an order of magnitude.

Decoupling Capacitors with N-body.

Figure 1:
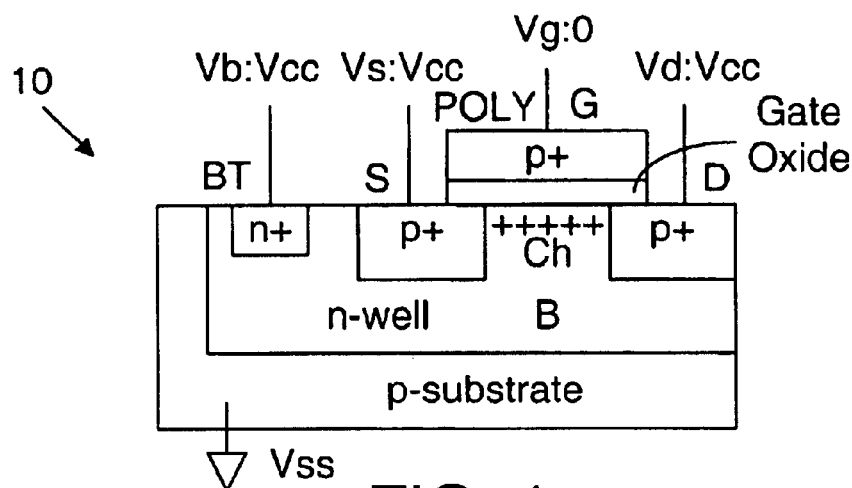
FIG. 1 is a schematic cross-sectional representation of a prior art capacitor.

Referring to FIG. 1, a prior art PMOS transistor capacitor 10 includes a p-substrate, n-well, a p+ source S, a p+ drain D, p+ polysilicon gate electrode (poly) G, and an n+ body tap BT for a body B. According to the terminology of the present disclosure, transistor capacitor 10 is called a p+/p+ cap on n-body (n-well), where the first p+ signifies the poly type and the second p+ signifies the type of the S/D regions. Note that in the case of a capacitive structure is not particularly meaningful to call one diffusion region a source and the other a drain, but it is done for convenience in nomenclature. Note that source/drain diffusions are not necessary in every embodiment of the invention, however, they may reduce series resistance to help with the RC frequency response. A surface 12 is immediately beneath the gate oxide. A channel Ch is under the surface of the gate oxide. In the present disclosure, that area will be called a channel, even in the case of a MOC-C structure, which is not a transistor. Transistor capacitor 10 has voltage applied as follows: the body voltage Vb is at the power supply voltages Vcc (sometimes called Vdd), the source and drain voltages Vs and Vd are both Vcc, and the gate voltage $V_G$ and the p-substrate are both at ground (called Vss or 0). The substrate can be grounded from beneath, above, or elsewhere. In FIG. 1, Vg is tied to Vss. In some embodiments, however, G might not be tied to Vss and might be a non-zero and non-Vcc value.

Figure 2:
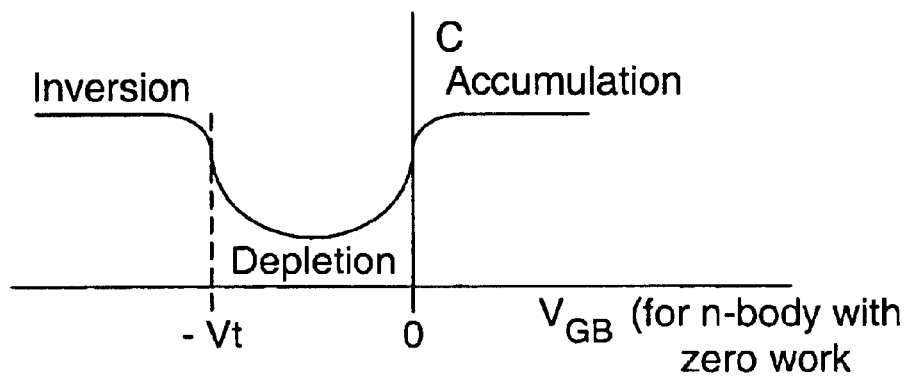
FIG. 2 is a graphical representation of a capacitance v. gate-to-body voltage for capacitors with n-bodies with a zero work function.

FIG. 2 illustrates a capacitance vs. gate-to-body voltage $V_{GB}$ curve for n-body (e.g., n-well) capacitive structures with a zero work function because the poly and body have the same type. Note that a drain and source voltage may be the same as the body voltage. The curve is intended to only show general relationships, not precise values or shapes. The actual curve could look somewhat different. Further, the shape of the curve may change at different frequencies. As can be seen, the capacitance is higher in accumulation and inversion and is lower in depletion. Vt is a threshold voltage. Generally, although the boundaries between accumulation, depletion, and inversion modes may be inexact, accumulation mode occurs when $0<V_{GB}$, depletion mode occurs when $-Vt<V_{GB}<0$, and inversion mode occurs when $V_{GB}<-Vt$.

Figure 3:
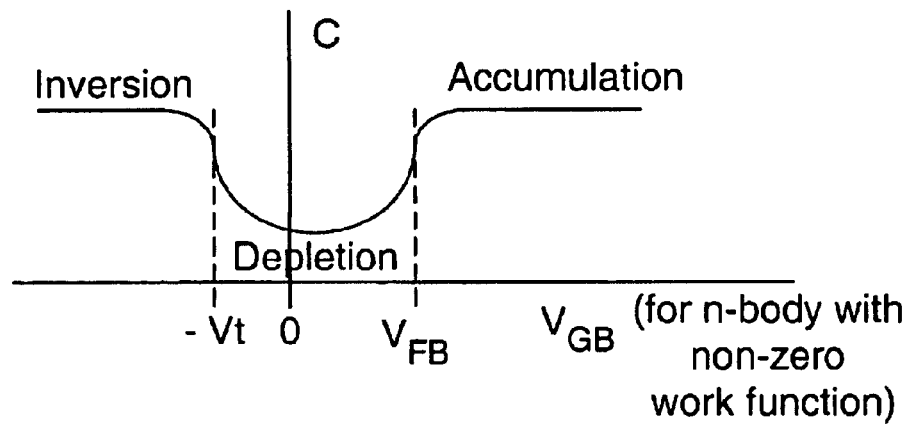
FIG. 3 is a graphical representation of a capacitance v. gate-to-body voltage for capacitors with n-bodies with a non-zero work function.

FIG. 3 illustrates a capacitance vs. gate-to-body voltage $V_{GB}$ curve for n-body capacitive structures with a non-zero work function (non-zero flat band voltage $V_{FB}$.) because the poly and body have a different type. The curve is intended to only show general relationships, not precise values or shapes. The actual curve could look somewhat different. Further, the shape of the curve may change at different frequencies. As can be seen, the capacitance is higher in accumulation and inversion and is lower in depletion. $V_{FB}$ for a heavily doped poly is approximately 1.0 volts. Generally, although the boundaries between accumulation, depletion, and inversion modes may be inexact, accumulation mode occurs when $V_{FB}<V_{GB}$, depletion mode occurs when $-Vt<V_{GB}<V_{FB}$, and inversion mode occurs when $V_{GB}<-Vt$. Note that the relative distance between -Vt and 0 and between 0 and $V_{FB}$ between 0 and Vt is not intended to be restrictive on actual values of $V_{FB}$ or Vt, which may vary from embodiment to embodiment.

Consider the case of prior art transistor capacitor 10 of FIG. 1. The curve of FIG. 3 would apply because there is an n-body and the poly and body have different types, so there is a non-zero work function. The flatband voltage ($V_{FB}$) of this structure is approximately 1V. In the case of FIG. 1, $V_{GB}$=-Vcc, which is more negative than is -Vt. Therefore, transistor capacitor 10 is in the inversion mode (more specifically, the channel is in inversion because it includes holes which are an opposite type of the body). Accordingly, it has a very high (perhaps a maximum) capacitance per unit area, very good frequency response and low series resistance. However, it also has leakage through gate oxide, especially for thin gate oxides is also high (perhaps a maximum). Vcc should be greater than Vt for this decap configuration. Note that the capacitance as a function of frequency and resistance in series with the cap (for displacement current) are representative of the Q-factor of the decap. Note that the flatband voltage ($V_{FB}$) is about 1V (not zero) for the PMOS cap in inversion because p+ poly gate and n-body.

Figure 4:
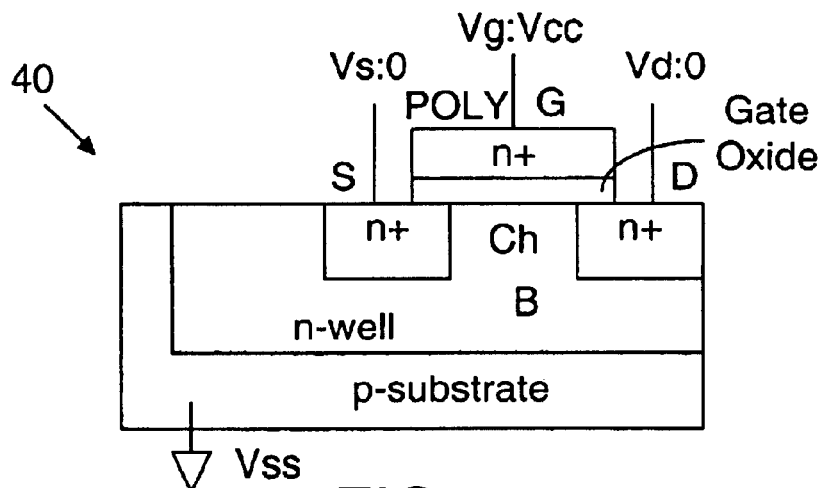
FIG. 4 is a schematic cross-sectional representation of a capacitor according to some embodiments of the invention.

FIG. 4 illustrates a MOS-C 40 according to some embodiments of the invention. Note that the term MOS (metal oxide semiconductor) is intended to be interpreted broadly where the metal is not restricted to any particular type of conductor (i.e., it does not have to be polysilicon), an insulator does not have to have an oxide, and the semiconductor portion is not restricted to a particular type of structure. MOS-C 40 is designated n+/n+ on n-body, according to the above described nomenclature (i.e., poly is n+, S/D is n+). Vg is Vcc and S/D/B are at 0 (Vss). The curve of FIG. 2 will apply because an n-well is used and the poly and body have the same type. $V_{FB}$ of MOS-C 40 is 0V. $V_{GB}$=Vcc, so MOS-C 40 is in the accumulation mode (the channel is accumulated by electrons, which are the same type as the body). With the configuration of FIG. 4, it may be desirable to allow such a layout (drawing n-poly on n-well) in design tools. MOS-C 40 works with all Vcc values. It has high (good) capacitance per unit area at slightly lower leakage. It has good frequency response and low series resistance.

Figure 5:
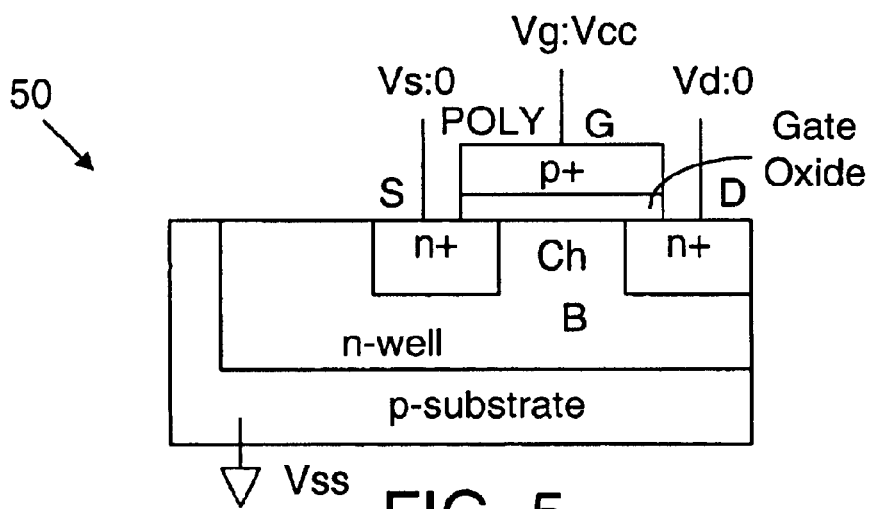
FIG. 5 is a schematic cross-sectional representation of a capacitor according to some embodiments of the invention.

"FIG. 5 illustrates MOS-C 50 according to some embodiments of the invention. MOS-C 50 is designated p+/n+ on n-body, according to the above described nomenclature. Vg is Vcc and S/D/B are at 0 (Vss). The curve of FIG. 3 will apply because an n-well is used and the poly and body have a different type. $V_{FB}$ of MOS-C 50 is approximately 1V. $V_{GB}$=Vcc. If Vcc>$V_{FB}$, then MOS-C 50 is in the accumulation mode (channel accumulates) and if MOS-C<$V_{FB}$, then MOS-C 50 is in the depletion mode (channel depletes). When Vcc=$V_{FB}$, the mode is between accumulation and depletion mode. In some embodiments of the present invention, Vcc is less than $V_{FB}$ so that MOS-C 50 will be in the depletion mode and leakage will be reduced. This configuration may require special layout. MOS-C 50 has lower capacitance per unit area but with much lower leakage because of the depletion mode (there are fewer carriers to leak). It has good frequency response, but may have high series resistance. Note that the structure resembles the buried channel MOS transistor structure."

Figure 6:
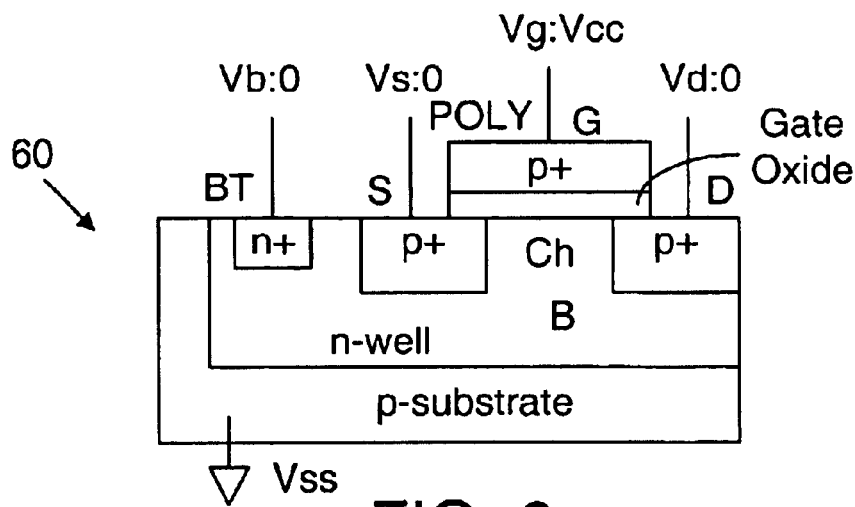
FIG. 6 is a schematic cross-sectional representation of a capacitor according to some embodiments of the invention.

FIG. 6 illustrates a PMOS transistor capacitor 60 MOS-C 60 according to some embodiments of the invention. Transistor capacitor 60 is designated p+/p+ on n-body, according to the above described nomenclature. Vg is Vcc and S/D/B are at 0 (Vss) (opposite of FIG. 1). The curve of FIG. 3 will apply because an n-well is used and the poly and body have a different type. $V_{FB}$ of MOS-C 50 is approximately 1V. $V_{GB}$=VCC. If Vcc>$V_{FB}$, then MOS-C 60 is in the accumulation mode (channel accumulates) and if MOS-C<$V_{FB}$, then MOS-C 60 is in the depletion mode (channel depletes). In some embodiments of the present invention, Vcc is less than $V_{FB}$ so that MOS-C 60 will be in the depletion mode and leakage will be reduced. MOS-C 60 has lower capacitance per unit area but with much lower leakage because of the depletion mode (there are fewer carriers to leak). However, frequency response and series resistance may be an issue.

Decoupling Capacitors with P-body.

The following describe examples of transistors and MOS-C capacitive structures with p-bodies (p-well or p-substrate). Note that although p-wells are shown the body could be just the p-substrate. Further, the substrate could be an n-type with a p-well.

Figure 7:
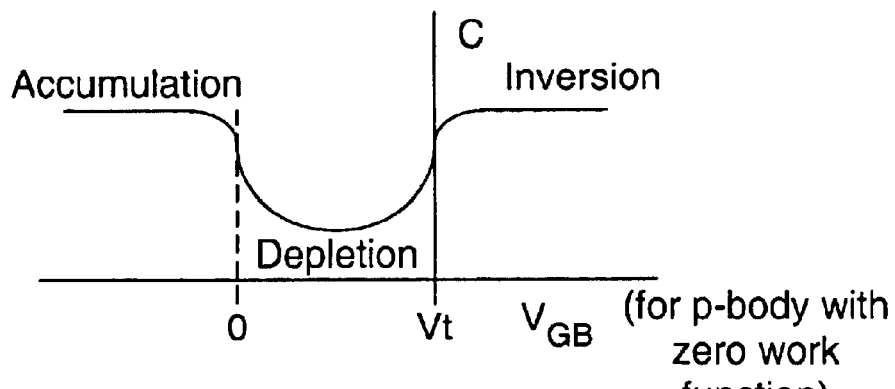
FIG. 7 is a graphical representation of a capacitance v. gate-to-body voltage for capacitors with p-bodies with a zero work function.

FIG. 7 illustrates a capacitance vs. gate-to-body voltage $V_{GB}$ curve for p-body capacitive structures with a zero work function because the poly and body have the same type. The curve is intended to only show general relationships, not precise values or shapes. The actual curve could look somewhat different. Further, the shape of the curve may change at different frequencies. As can be seen, the capacitance is higher in accumulation and inversion and is lower in depletion. Generally, although the boundaries between accumulation, depletion, and inversion modes may be inexact, accumulation mode occurs when $V_{GB}<0$, depletion mode occurs when $0<V_{GB}<Vt$, and inversion mode occurs when $V_{GB}>Vt$.

Figure 8:
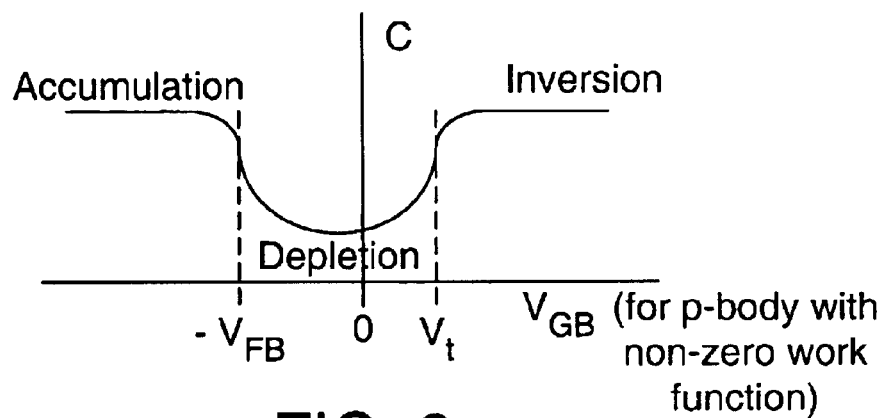
FIG. 8 is a graphical representation of a capacitance v. gate-to-body voltage for capacitors with p-bodies with a non-zero work function.

FIG. 8 illustrates a capacitance vs. gate-to-body voltage $V_{GB}$ curve for p-body capacitive structures with a non-zero work function (non-zero flat band voltage $V_{FB}$.) because the poly and body have a different type. The curve is intended to only show general relationships, not precise values or shapes. The actual curve could look somewhat different. Further, the shape of the curve may change at different frequencies. As can be seen, the capacitance is higher in accumulation and inversion and is lower in depletion. $V_{FB}$ for a heavily doped poly is approximately 1.0 volts (although it is in the negative region of the curve). Generally, although the boundaries between accumulation, depletion, and inversion modes may be inexact, accumulation mode occurs when $V_{GB}<-V_{FB}$ (e.g., −1v), depletion mode occurs when $-V_{FB}<V_{GB}<Vt$, and inversion mode occurs when $Vt<V_{GB}$. Note that the relative distance between $-V_{FB}$ and 0 and between 0 and Vt is not intended to be restrictive on actual values of $V_{FB}$ or Vt, which may vary from embodiment to embodiment.

Figure 9:
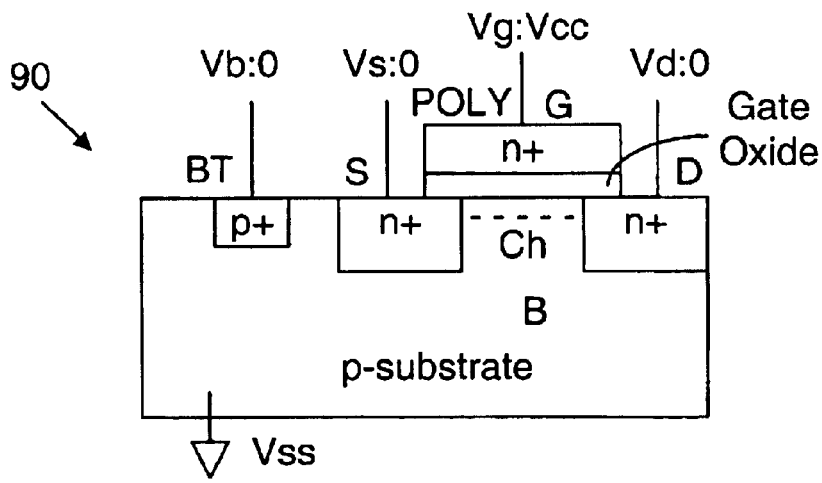
FIG. 9 is a schematic cross-sectional representation of a prior art capacitor.

FIG. 9 illustrates a prior art NMOS transistor capacitor 90 designated is designated n+/n+ on p-body, according to the above described nomenclature. In this case, it is a p-body is a p-substrate, but it could be a p-well on an n-substrate or a p-well in a p-substrate. Vg=Vcc and S/D/B are 0 (Vss). Since the poly and body have a different type, the curve of FIG. 8 is used. $V_{GB}$=Vcc. On curve 8, Vcc is greater than Vt, so transistor capacitor 90 is operating in inversion mode (the channel is in inversion). Decap 90 does not require a triple well process and uses no special layout requirements. It has very high (perhaps a maximum) capacitance per unit area, very good frequency response and low series resistance. The main issue is that leakage through gate oxide specially for thin gate oxides is also high (perhaps a maximum). Vcc should be greater than Vt for this decap configuration.

Figure 10:
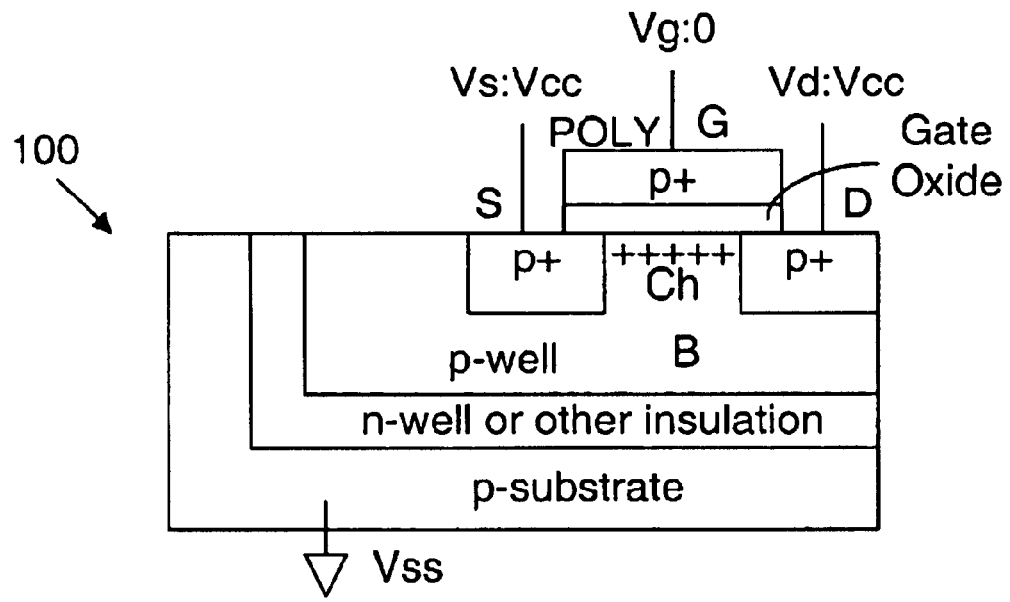
FIG. 10 is a schematic cross-sectional representation of a capacitor according to some embodiments of the invention.

FIG. 10 illustrates a MOS-C capacitor 100 with a p+/p+ on p-body configuration, according to the above nomenclature. Although a p-well is illustrated it is not necessary. Vg=0 (Vss) and S/D/B=Vcc. Because the poly and body are the same type, the curve of FIG. 7 applies. $V_{GB}$=−Vcc, so that capacitor 100 is in accumulation mode (channel would be accumulated). In some embodiments, capacitor 100 includes an n-body or other insulator between the p-well and p-substrate. The purpose is to prevent the Vcc voltage from influencing the voltage of the substrate or other bodies. This triple well process may need to additional layout (drawing P-poly on P-well) in the design tools. Decap 100 works with all Vcc values. It has high (good) capacitance per unit area at slightly lower leakage. It has good frequency response and low series resistance.

Figure 11:
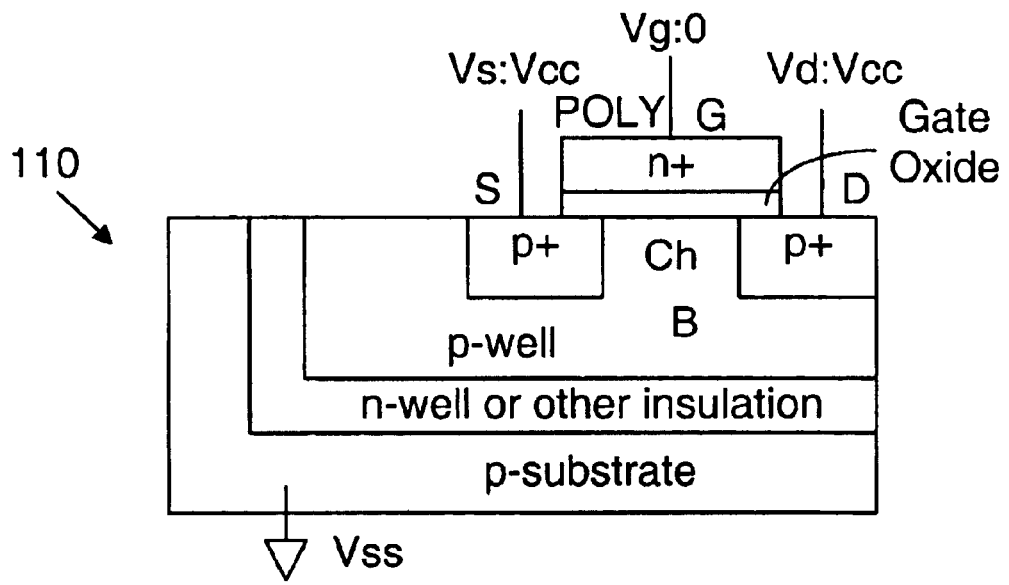
FIG. 11 is a schematic cross-sectional representation of a capacitor according to some embodiments of the invention.

FIG. 11 illustrates a MOS-C capacitor 110 with a n+/p+ on p-body configuration, according to the above-described nomenclature. Although a p-well is illustrated it is not necessary. Vg=0 (Vss) and S/D/B=Vcc. Because the poly and body are a different type, the curve of FIG. 8 applies. $V_{GB}$=−Vcc. If Vcc>$V_{FB}$ (−Vcc<−$V_{FB}$), then capacitor 110 would be in accumulation mode (channel would be accumulated). If Vcc<$V_{FB}$ (−Vcc>−$V_{FB}$), then capacitor 110 would be in depletion mode (channel would be depleted). To help with leakage, in some embodiments, the depletion mode is used. In some embodiments, capacitor 110 includes an n-body or other insulator between the p-well and p-substrate. Capacitor 110 has lower capacitance per unit area at much lower leakage. It has good frequency response, but high series resistance.

Figure 12:
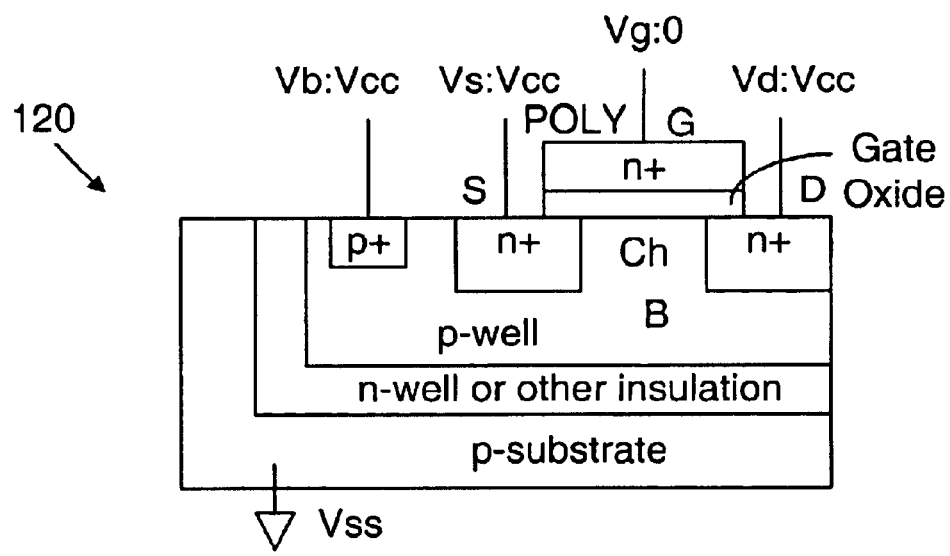
FIG. 12 is a schematic cross-sectional representation of a capacitor according to some embodiments of the invention.

FIG. 12 illustrates an NMOS transistor 120 with a n+/n+ on a p-body configuration according to the above-described nomenclature. Although a p-well is illustrated it is not necessary. Vg=0 (Vss) and S/D/B=Vcc. Because the poly and body are a different type, the curve of FIG. 8 applies. $V_{GB}$=−Vcc. If Vcc>$V_{FB}$ (−Vcc<−$V_{FB}$), then capacitor 120 would be in accumulation mode (channel would be accumulated). If Vcc<$V_{FB}$ (−Vcc>−$V_{FB}$), then capacitor 120 would be in depletion mode (channel would be depleted). To help with leakage, in some embodiments, the depletion mode is used. In some embodiments, capacitor 120 includes an n-body or other insulator between the p-well and p-substrate. Leakage is good (lower) in this configuration. However, frequency response and series resistance may be an issue. This configuration may require a triple well process.

An Appendix before the claims provides a comparison summary table for the above illustrated capacitors as wells as other capacitors within the scope of some embodiments of the invention.

Other Information and Embodiments

Figure 13:
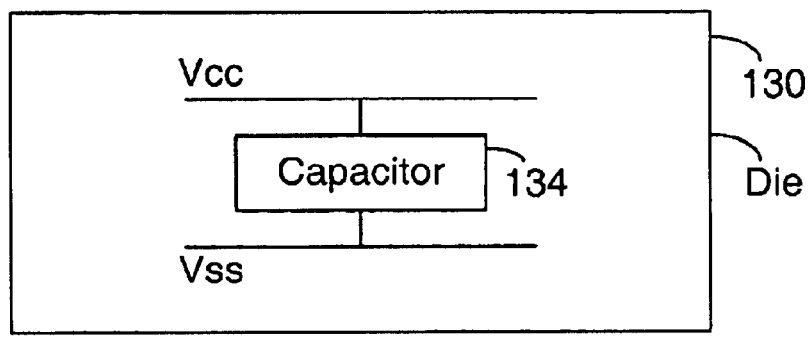
FIG. 13 is a block diagram representation of a die with a capacitor according to some embodiments of the invention.

FIG. 13 illustrates a die 130 in which capacitors (e.g., capacitor 134) including one or more of the configurations described herein may be included. Die 130 may be any of a various types of electrical devices including a microprocessor, DSP (digital signal processor), embedded controller, ASIC (application specific integrated circuit), and communication chip.

Figure 14:
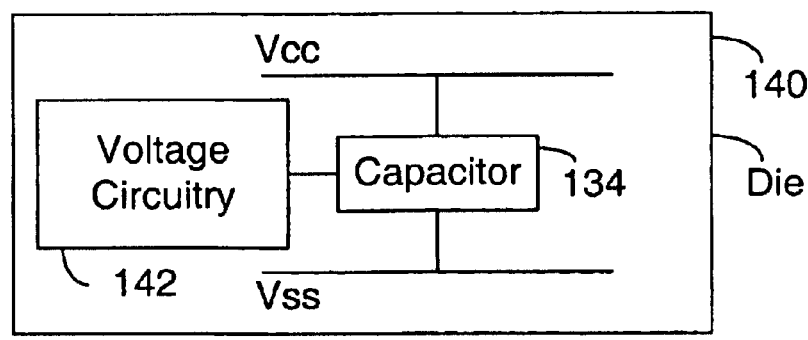
FIG. 14 is a block diagram representation of a die with a capacitor and voltage circuitry according to some embodiments of the invention.

As described above, in some embodiments, it is desirable to have a capacitor be in depletion mode. In many situations, it would also be desirable to have the capacitor be close to accumulation or inversion mode. Note that in FIGS. 2, 3, 7, and 8, in depletion mode the curve increases toward accumulation or inversion mode. It would be possible to tweak the capacitance by adjusting the gate voltage, body voltage, source/drain voltage, threshold voltage, and/or doping levels. Referring to FIG. 14, a die 140 includes capacitor 134 (which is representative of one or more of the various capacitors described therein). Die 140 includes voltage circuitry 142, which can provide the voltage(s) for one or more of the body, gate, and source/drain to provide a desired capacitance level. Changing the body voltage may make a capacitor have a forward or reverse body bias. Note that Vt changes as the body bias changes. There may also be a feedback mechanism to obtain a desired capacitance level.

Merely as an example, in some embodiments, it is believed that effective capacitance may be reduced by approximately 25%, while leakage reduces by approximately a factor of 100 for approximately a 1V power supply technology. Capacitance reduction is observable in the C-V curve as the capacitor is biased in a depletion mode (close to accumulation region). The leakage reduction is due to there being fewer carriers in depleted channel under the gate oxide to tunnel through the thin gate oxide. The Q-factor of such capacitor will be similar to a MOS transistor cap in inversion specially if we do not rely on minority carrier generation and recombination to provide the carriers need to respond to the AC signal superimposed on the decap. We can compensate for the reduced capacitance by using slightly larger area capacitor if we have to lower the leakage through the decap by more than an order of magnitude. The invention accordingly supports additional supply voltage scaling and development of process technologies for low voltage, high performance and low power CMOS circuits. In the future, we can continue to utilize decaps for noise decoupling in our IC's with our proposed configuration even as we scale the gate oxide thickness required for the faster scaled transistors. Our proposed solution is compatible with current processing technology.

The invention may be used in connection with SOI (silicon on insulator) configurations.

Also, as is well known, power supply and ground voltages are not necessarily constant, but rather have fluctuations because of noise, load, or other reasons.

FETs other than MOSFETs could be used. Although the illustrated embodiments include enhancement mode transistors, depletion mode transistors could be used with modifications to the circuit which would be apparent to those skilled in the art having the benefit of this disclosure.

"Some embodiments of the invention may include additional capacitors between the conductors carrying power supply and ground voltages, at least some of which are not in the depletion mode."

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

Appendix: Comparison Summary Table listing some possibilities. This is not intended to be comprehensive. Other possibilities exist. Some of the information is merely a best guess.

| Type | Vcc | Mode | Cap | Leakage | Hi freq | Rs | Comment |
|---|---|---|---|---|---|---|---|
| DeCap on n-well | | | | | | | |
| p+/p+ (prior art) (FIG. 1) | >Vt | inv | max | max | good | low | |
| n+/n+ (FIG. 4) | All | acc | ~max | slightly less | good | low | No LO |
| p+/p+ (FIG. 6) | <1V | dep | lower | lower | OK | high | No LO |
| p+/p+ | >1V | acc | ~max | slightly less | OK | high | No LO |
| p+/n+ (FIG. 5) | <1V | dep | lower | lower | OK | high | LO |
| p+/n+ | >1V | acc | ~max | slightly less | good | low | LO |
| n+/p+ | >1V + Vt | inv | max | max | good | low | LO, Vcc? |
| n+/p+ | <1V + Vt | dep | lower | lower | OK | high | LO, Vcc? |
| DeCap on p-well | | | | | | | |
| n+/n+ (prior art) (FIG. 9) | >Vt | inv | max | max | good | low | |
| p+/p+ (FIG. 10) | All | acc | max | slightly less | good | low | No LO |
| n+/n+ (FIG. 12) | <1V | dep | lower | lower | OK | high | No LO, TW |
| n+/n+ | >1V | acc | max | slightly less | OK | high | No LO, TW |
| n+/p+ (FIG. 11) | <1V | dep | lower | lower | OK | high | LO, TW |
| n+/p+ | >1V | acc | ~max | slightly less | good | low | LO, TW |
| p+/n+ | >1V + Vt | inv | max | max | good | low | LO, Vcc? |
| p+/n+ | <1V + Vt | dep | lower | lower | OK | high | LO, Vcc? |

Key:
p+/p+ on N-Well means a capacitor with p+ poly and p+ S/D regions on N-Well
No LO = No Layout or tool change required over conventional design
LO = May require layout change as compared to that of convention design
$V_{FB}$ = ~1V used for Vcc column
TW = May use triple well to insulate body of capacitor

What is claimed is:

1. A die, comprising:

a first conductor carrying a power supply voltage;

a second conductor carrying a ground voltage; and a semiconductor decoupling capacitor to provide decoupling capacitance between the first and second conductors, the semiconductor decoupling capacitor including:

(a) a gate electrode coupled to the first conductor to receive the power supply voltage, (b) a diffusion coupled to the second conductor to receive the ground voltage, and (c) a body to receive the ground voltage through the diffusion, the semiconductor decoupling capacitor thereby being in depletion mode;

wherein the diffusion is a first diffusion and the semiconductor decoupling capacitor further includes a second diffusion coupled to the second conductor to receive the around voltage and wherein the body receives the ground voltage through the first and second diffusions.

2. The die of claim 1, wherein gate electrode is p-type and the diffusion and the body are n-type.

3. The die of claim 1, wherein gate electrode is p-type and the diffusion and the body are n-type, with the diffusion being more heavily doped than the body.

4. The die of claim 1, wherein the first and second diffusions are source/drain diffusions.

5. The die of claim 1, wherein the first and second diffusions are more heavily doped than the body.

6. The die of claim 1, wherein the semiconductor decoupling capacitor has a flatband voltage and wherein the power supply voltage has a smaller absolute value than does the flatband voltage.

7. The die of claim 1, wherein gate electrode is p-type and the diffusion and the body are n-type, and wherein the diffusion is a body tap diffusion and the semiconductor decoupling capacitor further includes first and second source/drain diffusions that are p-type.

8. The die of claim 7, wherein the first and second source/drain diffusions are coupled to the second conductor to receive the ground voltage.

9. The die of claim 7, wherein the body tap diffusion and first and second source/drain diffusions are more heavily doped than the body.

10. The die of claim 7, wherein the semiconductor decoupling capacitor has a flatband voltage and wherein the power supply voltage has a smaller absolute value than does the flatband voltage.

11. A die, comprising:

a first conductor carrying a power supply voltage;

a second conductor carrying a ground voltage; and a semiconductor decoupling capacitor to provide decoupling capacitance between the first and second conductors, the semiconductor decoupling capacitor including:

(a) a gate electrode coupled to the second conductor to receive the ground voltage, (b) a diffusion coupled to the first conductor to receive the power supply voltage, (c) a body to receive the power supply voltage through the diffusion, the semiconductor decoupling capacitor thereby being in depletion mode, (d) a substrate, and (e) an insulation between the substrate and the body;

wherein the diffusion is a first diffusion and the semiconductor decoupling capacitor further includes a second diffusion coupled to the first conductor to receive the power supply voltage and wherein the body receives the power supply voltage through the first and second diffusions.

12. The die of claim 11, wherein gate electrode is n-type and the diffusion and the body are p-type.

13. The die of claim 11, wherein gate electrode is n-type and the diffusion and the body are p-type, with the diffusion being more heavily doped than the body.

14. The die of claim 11, wherein the first and second diffusions are source/drain diffusions.

15. The die of claim 11, wherein the first and second diffusions are more heavily doped than the body.

16. The die of claim 11, wherein the semiconductor decoupling capacitor has a flatband voltage and wherein the power supply voltage has a smaller absolute value than does the flatband voltage.

17. The die of claim 11, wherein gate electrode is n-type and the diffusion and the body are p-type, and wherein the diffusion is a body tap diffusion and the semiconductor decoupling capacitor further includes first and second source/drain diffusions that are n-type.

18. The die of claim 17, wherein the first and second source/drain diffusions are coupled to the second conductor to receive the ground voltage.

19. The die of claim 17, wherein the body tap diffusion and first and second source/drain diffusions are more heavily doped than the body.

20. The die of claim 17, wherein the semiconductor decoupling capacitor has a flatband voltage and wherein the power supply voltage has a smaller absolute value than does the flatband voltage.

* * * * *

UNITED STATES PATENT AND TRADEMARK OFFICE
CERTIFICATE OF CORRECTION

PATENT NO.     : 6,828,638 B2
DATED          : December 7, 2004
INVENTOR(S)    : Keshavarzi et al.

It is certified that error appears in the above-identified patent and that said Letters Patent is hereby corrected as shown below:

Column 9,
Line 20, delete "around" and insert -- ground --.

Signed and Sealed this

Seventeenth Day of May, 2005

JON W. DUDAS
*Director of the United States Patent and Trademark Office*